(12) United States Patent
Lauffer

(10) Patent No.: US 6,369,334 B1
(45) Date of Patent: Apr. 9, 2002

(54) PRINTED CIRCUIT BOARD WITH WIRE ADDS AND COMPONENT ADDS HAVING 7-SHAPED AND SEMICIRCULAR TERMINATIONS

(75) Inventor: John M. Lauffer, Waverly, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/404,615

(22) Filed: Sep. 23, 1999

Related U.S. Application Data

(60) Division of application No. 08/864,632, filed on May 28, 1997, which is a continuation-in-part of application No. 08/669,362, filed on Aug. 19, 1996, now Pat. No. 5,933,827.

(51) Int. Cl.[7] ................................................. H05R 9/09
(52) U.S. Cl. ....................................... 174/261; 174/262
(58) Field of Search ................................ 174/255, 262, 174/261, 260; 361/777, 779, 780

(56) References Cited

U.S. PATENT DOCUMENTS

| | | |
|---|---|---|
| 3,610,811 A | 10/1971 | O'Keefe |
| 5,112,230 A | 5/1992 | DeSimone |
| 5,181,317 A | 1/1993 | Nishihara et al. |
| 5,220,487 A | 6/1993 | Patel et al. |
| 5,308,928 A * | 5/1994 | Parla et al. .................. 174/265 |
| 5,434,365 A | 7/1995 | Mori et al. |
| 5,451,720 A | 9/1995 | Estes et al. |
| 5,665,650 A | 9/1997 | Lauffer et al. |
| 5,993,945 A * | 11/1999 | Russell et al. .............. 428/209 |
| 6,127,634 A * | 10/2000 | Higashiguchi et al. ...... 174/262 |

* cited by examiner

*Primary Examiner*—Kamand Cuneo
(74) *Attorney, Agent, or Firm*—Ratner & Prestia; Arthur J. Samodovitz, Esq.

(57) ABSTRACT

An electronic circuit card and a process of manufacturing the electronic circuit card. The process includes the steps of providing the electronic circuit card with external electrical circuits. A photoimageable dielectric layer is formed on the electronic circuit card. A metal foil layer is laminated on the photoimageable dielectric layer and the metal foil layer is patterned to form a wire and a component add land pattern. The photoimageable dielectric layer is patterned and the wire and the component add land pattern are electrically connected to the electronic circuit card through a T-shaper or semicircular terminal.

3 Claims, 7 Drawing Sheets

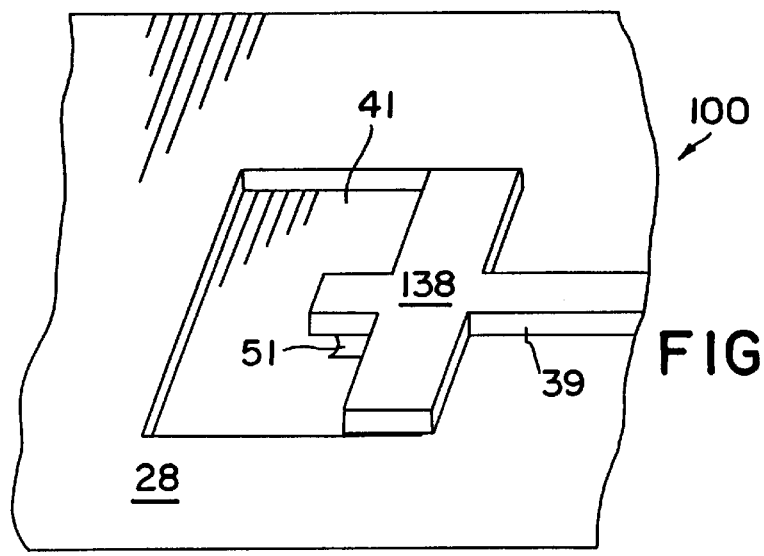
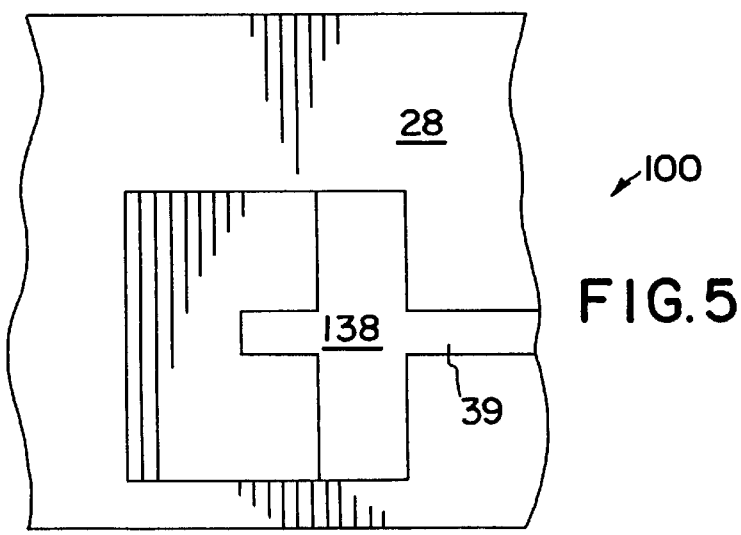
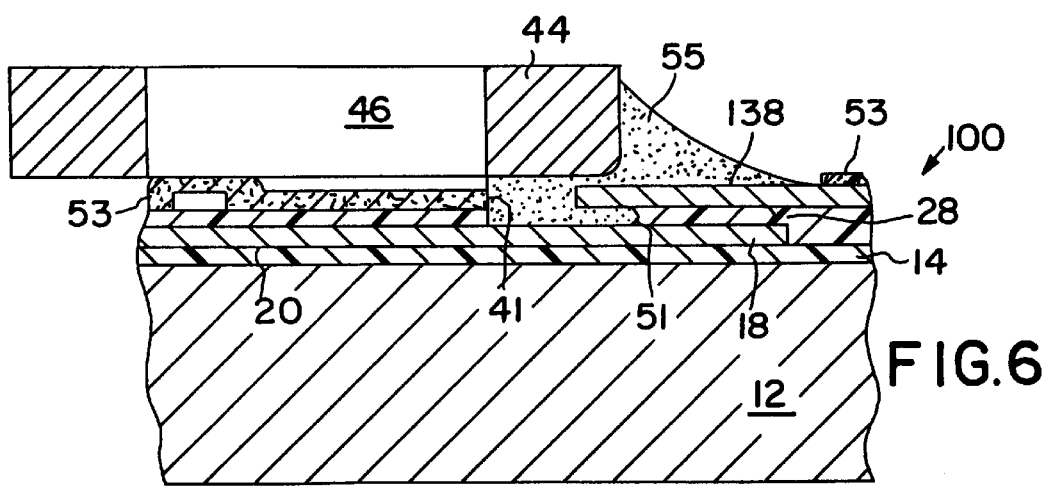

PRINTED CIRCUIT BOARD WITH WIRE ADDS AND COMPONENT ADDS HAVING 7-SHAPED AND SEMICIRCULAR TERMINATIONS

This application is a divisional of U.S. patent application Ser. No. 08/864,632, filed on May 28, 1997, allowed, which is a continuation-in-part of U.S. application Ser. No. 08/669,362 filed on Aug. 19, 1996 now U.S. Pat. No. 5,933,827.

FIELD OF THE INVENTION

The present invention relates generally to electronic circuit cards, and more particularly to a device and technique for adding wires and new components to an electronic circuit card.

BACKGROUND OF THE INVENTION

Electronic circuit cards such as printed circuit boards (PCBs) may utilize surface mount technology (SMT) cards or pin-in-hole (PIH). SMT cards used for high power applications typically may comprise a relatively thick carrier layer such as copper (for heat dissipation or ground plane), a plurality of circuit layers, and electronic components mounted on a surface of the outermost circuit layer. Each circuit layer comprises a metallization on an insulating sheet, for example, IBM ASM photo-imageable epoxy, epoxy-glass pre-preg, or the like. The metalization comprises conductors and surface lands. Each component may be soldered to a surface land on the outermost layer, and conductors in the outermost and inner layers may be used to interconnect the component to other components. If conductors in the inner layers are required for the component interconnection, then an inter-layer connection is required between the surface lands of the outermost and inner layers.

With the advent of accelerated product development cycles and product announcements, newly designed printed circuit boards are often produced in high volumes prior to complete electrical circuit debug. As a result, a possibility exists that a large quantity of the printed circuit boards will not perform electrically. Typically, wires must be added, moved, and/or deleted, and new components must be added and/or removed from the printed circuit board to correct this problem. It is not uncommon to manufacture early designs that require the addition of one hundred (100) or more wires and several new components. Wires that are added to the printed circuit board are typically referred to as "EC wires."

Several processes have been developed to add EC wires and components to a printed circuit board. One such process is typically referred to as "yellow wire." This process includes hand soldering of a discrete insulated wire from point to point on the printed circuit board. This is an extremely laborious, time consuming, and expensive process. The estimated cost of this process is $2.25 per EC wire added. This process is error prone because it involves manual reading of a schematic drawing and then soldering the wire to the proper points on the printed circuit board. Further, the addition of new components using this process can be difficult. Finally, the added wires are not cosmetically pleasing to the end user.

A study performed by International Business Machines Corporation examined a subset of the total printed circuit board designs produced from 1988–1990. The average number of EC wires per card was nine (9) or thirty (36) per panel. The total number of EC wires was observed as high as 150 wires per card with approximately 20% of the applications studied having 20 or greater wires per card. Using the "yellow wire" EC process described above, the average cost per panel for adding the necessary EC wires was $81.

A second process to correct printed circuit boards includes screen printing insulating and conducting inks on the surface(s) of the printed circuit board. New component lands can also be screen printed. Typically, this process includes three or more separate screen printing and curing steps. This process is more economical than the yellow wire process because all of the wires are screen printed at one time. This process suffers, however, from several problems.

First, wires having a resolution less than 0.0254 cm(0.010 inches) wide can not be screen printed because screen printing has a limited resolution. This limit also restricts the placement of wires on the printed circuit board. For example, it may be difficult to route a wire between two SMT lands because of the resolution limitation. In addition, conductive inks used in the screen printing process typically have $\frac{1}{30}$th to $\frac{1}{10}$th the conductivity of copper and, hence, can only be used for non-critical circuit lines where resistance is not a factor. Finally, the conductive inks are not solder wettable. As a result, problems may arise when wires are to be connected to SMT lands or added component lands where solder is to be applied.

A third method to correct printed circuit boards is Flexible Applique Rework (FAR) in which one or two-sided flex circuits including wire adds are fabricated and attached to the printed circuit board. Interconnects between the flex circuit and the circuit board are reflowed using solder. One disadvantage of this technique is the cost of the FAR. In addition, the FAR must be intricately profiled so that it does not interfere with the components that are to be added to the printed circuit board.

Hence, it is desirable to provide a low cost technique for printed circuit board EC wire and component additions, where the EC wires provide the same electrical performance as the original printed circuit board, and the integrity of the original printed circuit board is not compromised.

SUMMARY OF THE INVENTION

The invention is directed to an electronic circuit card. The electronic circuit card is made by the process including the steps of providing an electronic circuit card with external electrical circuits. A photoimageable dielectric layer is formed on the electronic circuit card. A metal foil layer is laminated on the photoimageable dielectric layer and the metal foil layer is patterned to form a wire and a component add land pattern. The photoimageable dielectric layer is patterned and the wire and the component add land pattern are electrically connected.

DESCRIPTION OF THE FIGURES

FIG. 4 is a perspective view of a portion of another electronic circuit card according to another embodiment of the present invention during formation; surface lands are provided in two circuit layers but are not yet interconnected.

FIG. 5 is a top view of the electronic circuit card of FIG. 4.

FIG. 6 is a side view of FIG. 5 after a component lead has been soldered to the surface lands.

DETAILED DESCRIPTION OF THE INVENTION

Overview

The invention is directed to an EC wire plane that is formed on an electronic circuit card such as a printed circuit board, to form additional EC wires and new component add land patterns. The EC wire plane includes at least one dielectric layer and one EC wire layer. The dielectric layer is formed on a coated or uncoated, but otherwise finished, electronic circuit card. A finished electronic circuit card is a card that has external electrical circuits and/or a solder mask. A copper foil layer is laminated on the electronic circuit card and etched in a pattern of wire adds and component add land patterns to form the EC wire layer. Interconnect vias are defined and interconnects from the electronic circuit card to the laminated EC layer are solder paste printed and reflowed as part of the standard SMT assembly process.

DESCRIPTION OF THE PREFERRED EMBODIMENTS

Figure 1:
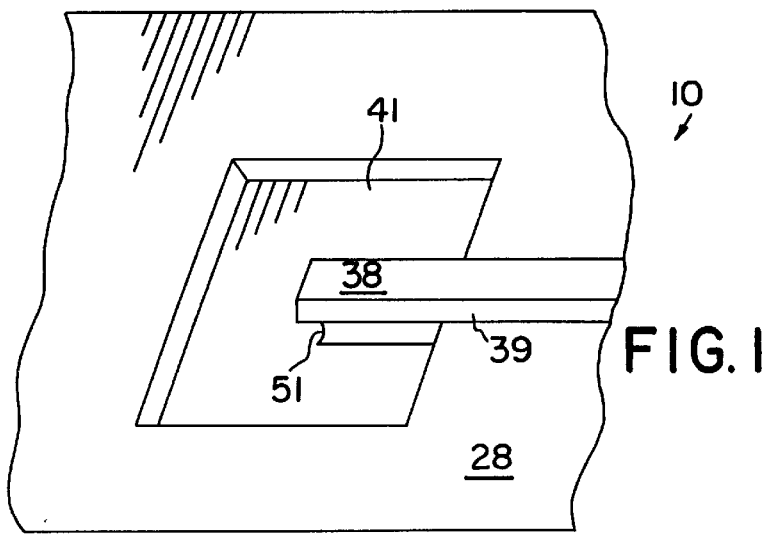
FIG. 1 is a perspective view of a portion of an electronic circuit card according to the present invention during formation; surface lands are provided in two circuit layers but are not yet interconnected.
Figure 2:
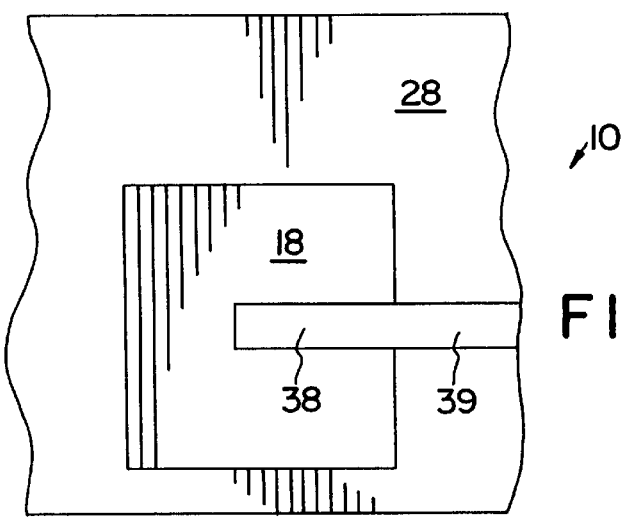
FIG. 2 is a top view of the electronic circuit card of FIG. 1.
Figure 3:
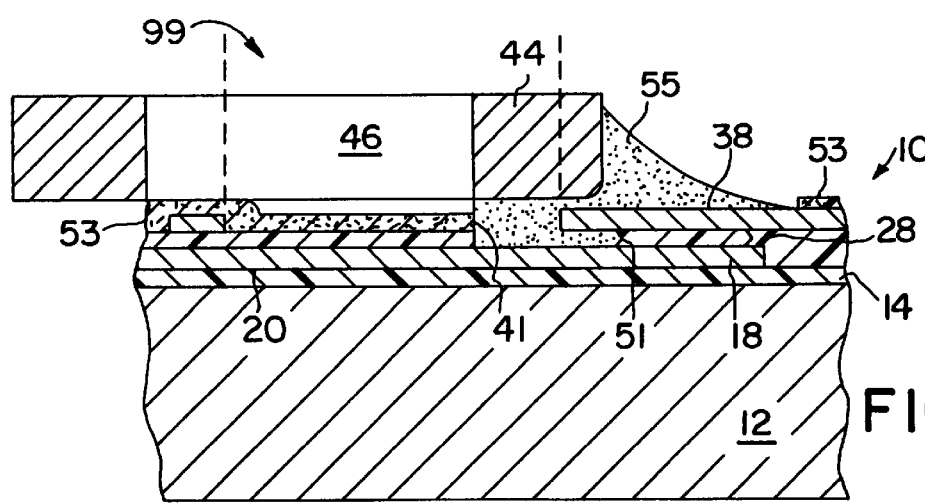
FIG. 3 is a side view of FIG. 2 after a component lead has been soldered to the surface lands.

Referring now to the drawings in detail wherein like reference numbers represent like elements throughout, FIGS. 1–3 illustrate an SMT power electronic circuit card generally designated 10 according to the present invention (although FIG. 1 illustrates the card during formation). In the illustrated embodiment, card 10 is a PCB utilizing SMT. Card 10 includes a carrier 12 which may comprise a copper layer or other layers of the printed circuit board.

To form the upper layers of card 10, a sheet 14 of dielectric material (for example, 0.00508 cm (0.002 inches) thick) such as IBM ASM photoimageable epoxy is laminated onto the carrier. Then, a copper foil layer is laminated onto sheet 14. Photolithography is used to define a metallization pattern and is then etched with cupric chloride to remove the unwanted copper. This yields the requisite metallization which includes a surface land 18 (for example, 0.09144 cm (0.036 inches)" by 0.14224 cm (0.056 inches) and conductor 20 which interconnects surface land 18 to another surface land (not shown). In the illustrated embodiment, surface land 18 has a solid rectangular shape, although a solid circular shape would also suffice. Next, another sheet 28 of ASM dielectric material (for example, 0.00508 cm (0.002 inches) thick) is laminated over the metallization on dielectric sheet 14 and the exposed regions of dielectric sheet 14. Next, another copper foil layer is laminated onto sheet 28, photolithography is used to define metallization and is then etched with cupric chloride to remove the unwanted copper. Conventional photolithography steps available in the art may be used to define the metallization pattern to include regions 38 and 39, where the copper foil layer remains, and region 99, as shown in FIG. 3, where the copper foil layer is removed by etching in cupric chloride. This yields the requisite metallization including a surface land 38 and a conductor 39 connected to surface land 38 to interconnect the surface land 38 to another component (not shown) on the outermost layer. According to the present invention, surface land 38 does not completely surround the perimeter of hole 41. FIG. 1 illustrates a narrow rectangular shape which protrudes over the inner surface land 18. As described in more detail below, FIG. 4 illustrates a "T" shape for the outermost surface land, FIG. 7 illustrates an outermost surface land which is rectangular and superimposed on a border region of surface land 18, but the outermost surface land could also be "U" shaped, "L" shaped, anything but completely closed.

After both dielectric layers 14 and 28 and both metallizations are formed as described above, a hole 41 (for example, 0.0762 cm(0.030 inches) by 0.02032 cm (0.050 inches)) is formed in dielectric sheet 28 as follows. Photo lithography is used to shield the region of dielectric sheet 28 above surface land 18. Then, layer 28 is exposed to light to harden (i.e. make insoluble) the exposed ASM material. Then, the ASM material under the shield is dissolved with propylene carbonate to produce (or "develop") the hole 41 which extends adjacent to surface land 38, through layer 28 and to surface land 18. The propylene carbonate also produces a gap 51 between surface lands 38 and 18. Next, a solder mask 53 is applied on layers 28 and 38 around the periphery of surface land 18 and solder paste (for example Alpha WS613 solder paste) comprising various size particles of 63% tin, 37% lead and a water soluble flux is applied over the hole 41 and surface land 38. Then, a lead 44 of a component 46 is positioned over the hole 41 and surface land 38. Typically, the lead will cover approximately half of hole 41 and part of the surface land 38 and is held in place by tackiness of the solder paste until the solder is reflowed. Next, the solder is reflowed (i.e. heated) and thereby flows by gravity and surface tension well into hole 41, onto surface land 18, against surface land 38, by capillary action into the gap 51 between surface lands 18 and 38 and again at lead 44 as illustrated. (Alternately, a wave soldering or solder leveling technique can be used to solder and thereby electrically interconnect the component lead 44 to surface lands 18 and 38.) The final solder arrangement is illustrated as 55. This forms a complete electrical connection between both surface lands and the component lead 44. Because surface land 38 does not surround hole 41, the solder does not bridge across hole 41 and instead forms a solid connection between the two surface lands as described above. Also, because surface land 38 does not surround hole 41 and the solder does not bridge, gases can escape along the perimeter of the hole 41 away from surface land 38 without pushing up the solder.

FIGS. 4–6 illustrate a second embodiment of an electronic circuit card generally designated 100 of the present invention. Card 100 is identical to card 10 except that outermost surface land 138 of card 100 is "T"-shaped to provide additional connection area.

Figure 7:
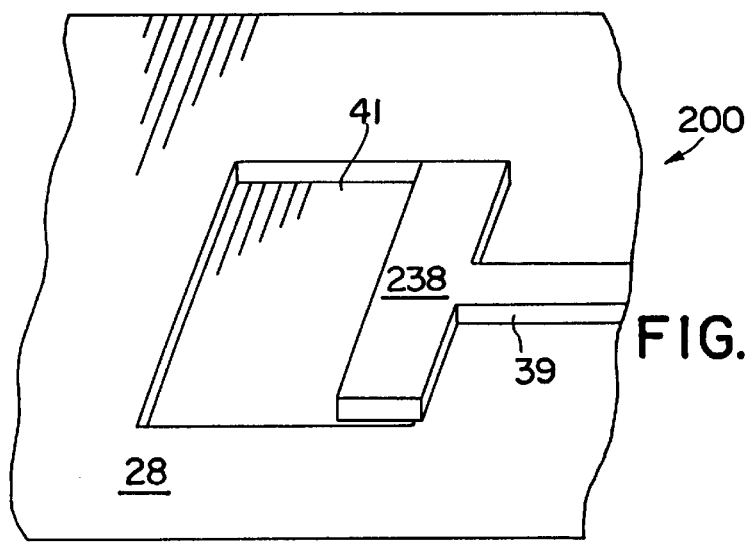
FIG. 7 is a perspective view of a portion of a third electronic circuit card according to a third embodiment of the present invention during formation; surface lands are provided in two circuit layers but are not yet interconnected.
Figure 8:
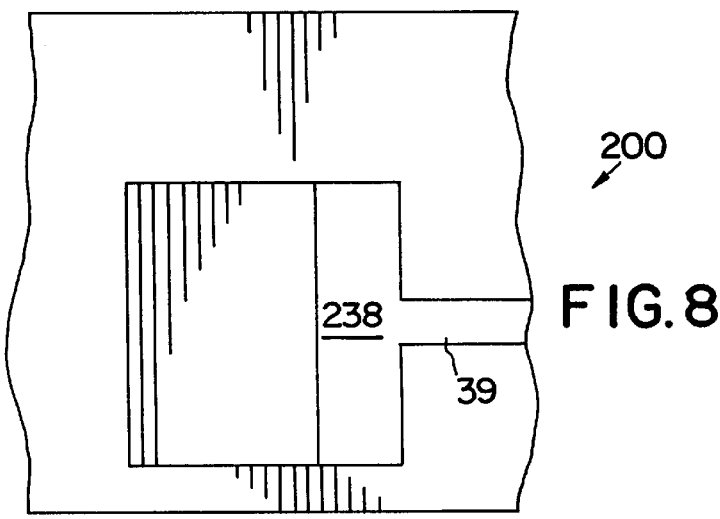
FIG. 8 is a top view of the electronic circuit card of FIG. 7.
Figure 9:
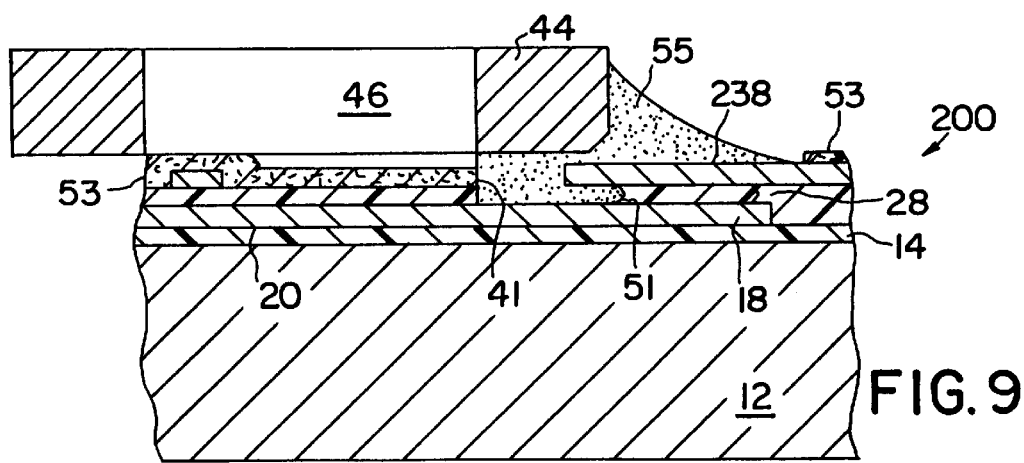
FIG. 9 is a side view of FIG. 8 after a component lead has been soldered to the surface lands.

FIGS. 7–9 illustrate a third embodiment of an electronic circuit card generally designated 200 of the present invention. Card 200 is identical to card 10 except that outermost surface land 238 of card 100 is superimposed on a border region of surface land 18.

Figure 10:
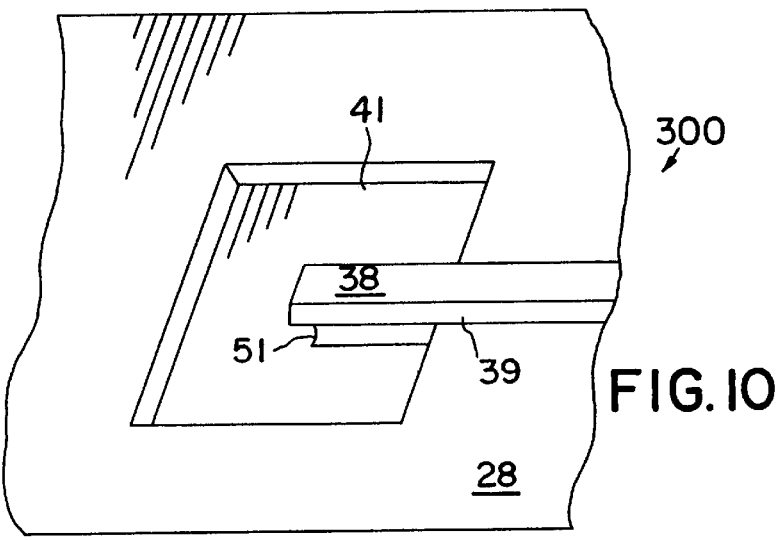
FIG. 10 is a perspective view of a portion of a fourth electronic circuit card according to the present invention during formation; a surface land is provided in one circuit layer but is not yet interconnected.
Figure 11:
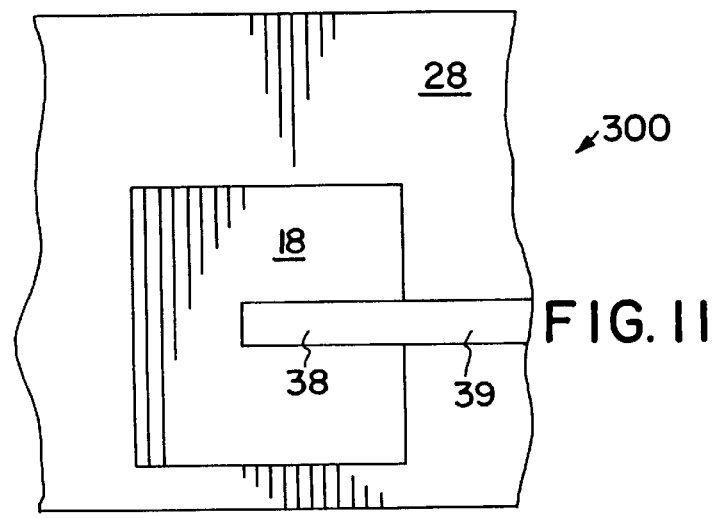
FIG. 11 is a top view of the electronic circuit card of FIG. 10.
Figure 12:
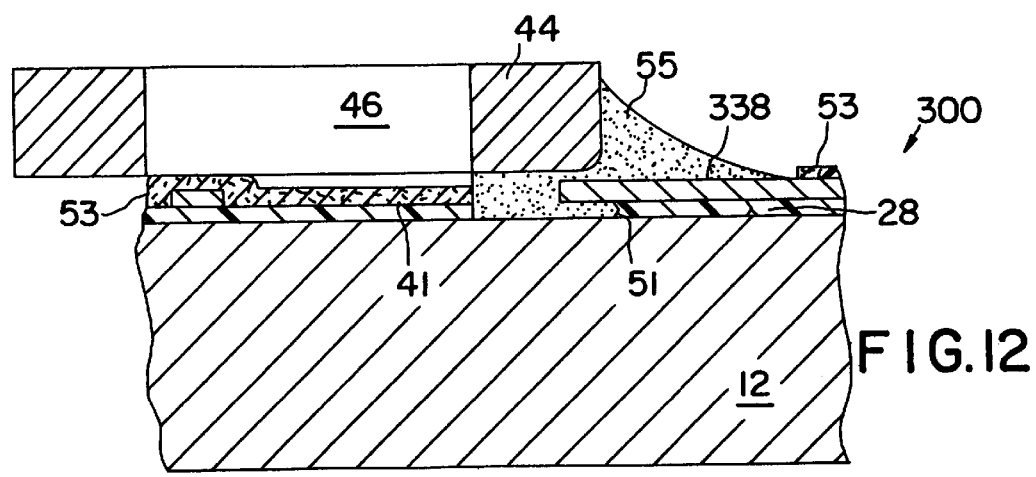
FIG. 12 is a side view of FIG. 11 after a component lead has been soldered to the surface land.

FIGS. 10–12 illustrate a fourth embodiment of an electronic circuit card generally designated 300 according to the present invention. Card 300 is identical to card 10 except that card 300 omits dielectric layer 14 and the metalization (surface land 18 and conductor 20) on layer 14. In card 300, layer 28 is laminated directly on the carrier 12. This configuration is appropriate where carrier 12 is a ground or power plane and it is desirable to connect surface land 38 and the component lead 44 directly to the ground or power plane.

Similarly, fifth and sixth embodiments of electronic circuit cards (not shown) according to the present invention can be made as in FIGS. 4–6 and 7–9, respectively, by omitting the dielectric layer 14 and the metalization (surface land 18 and conductor 20) on layer 14.

Based on the foregoing, electronic circuit cards embodying the present invention have been disclosed. However, numerous modifications and substitutions can be made without deviating from the scope of the present invention. For example, the inner surface land could have other shapes such as circular or oval. Also, the stated dimensions and materials are just examples and do not limit the scope of the present invention. Also, surface land 238 could be positioned along the periphery of surface land 18 instead of overlapping. Also, some applications require interconnection between two different layers of a PCB without mounting of a component lead. In such a case, the same PCB design as illustrated in any of the figures could be utilized, except that the component lead is omitted; the solder merely connects outer surface land 38 to inner surface land 18 in FIGS. 1–9, or connects outer surface land 38 directly to carrier 12 in FIGS. 10–12.

Figure 13:
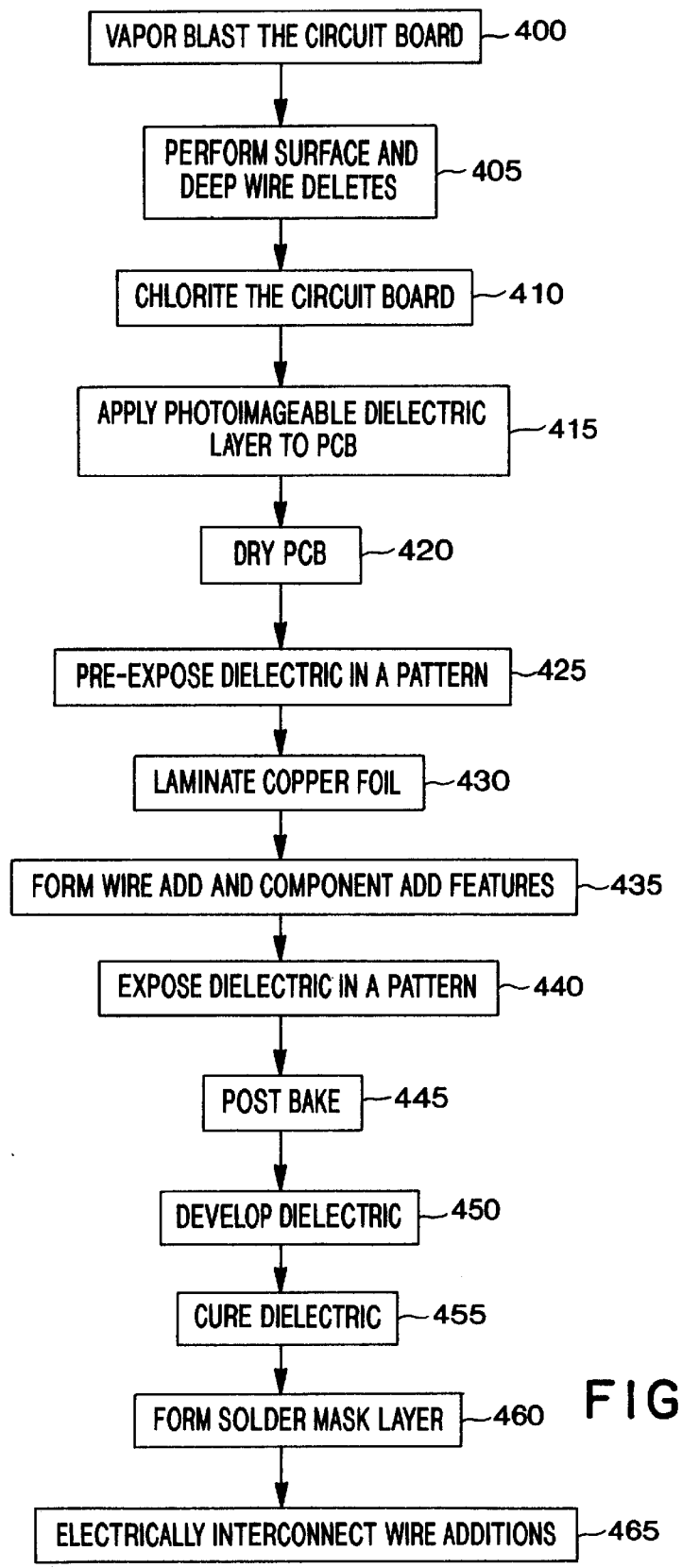
FIG. 13 is a flow chart diagram illustrating a process for adding wires and new components to an electronic circuit card board according to an exemplary embodiment of the present invention.
Figure 14:
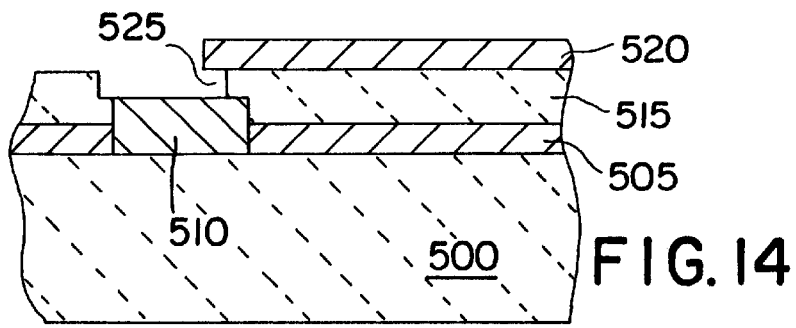
FIG. 14 is a schematic diagram of a printed circuit board produced using the process illustrated in FIG. 13.

FIG. 13 is a flowchart illustrating the process of correcting an electronic circuit card that requires EC wires or new component additions. In the exemplary embodiment, the electronic circuit card is a printed circuit board. At step 400, a coated printed circuit board 500, shown in FIG. 14, is vapor blasted. Vapor blasting is performed using, for example, a silicon dioxide slurry of silicon dioxide and water. This step roughens the surface of the solder mask 505 of finished circuit boards to improve adhesion for a dielectric layer 515, shown in FIG. 14, that is subsequently laminated on the printed circuit board 500. Step 400 may not be performed if the printed circuit is uncoated.

At step 405, surface and deep wire deletes are performed to remove circuit lines formed on the circuit board. The deletes are made using a controlled depth drill to cut unwanted circuit lines in predetermined locations. In a conventional delete process, the delete holes created by the deletes are filled with a dielectric material. In this process, the delete holes are filled during a subsequent lamination step described below.

At step 410, a chlorite process is performed on the printed circuit board. The chlorite process includes an acid microetch and an alkaline degrease process to remove debris from the delete operation and handling contamination. The chlorite process also promotes copper adhesion for the dielectric layer 515, shown in FIG. 14, by converting exposed areas of the external copper circuit lines formed on the printed circuit board 500 to copper oxide.

At step 415, a photoimageable dielectric layer 515, shown in FIG. 14, is formed on the printed circuit board 500. The dielectric layer 515 is formed by screen printing or dry film application. Materials suitable for use as the photoimageable dielectric layer 515 include photoimageable materials such as the materials used for a solder mask. Examples of such materials include IBM ASM/Morton LB-404 available from International Business Machines Corporation, VACREL™ available from the E.I. DuPont Corporation, and DSR3241 available from the ENTHONE Corporation. The dielectric layer 515 is applied to one or both sides of the printed circuit board requiring EC wire adds or component adds.

At step 420, the applied dielectric layer 515 is dried at 125° C. for 30 minutes to remove solvent from the dielectric layer 515, shown in FIG. 14. At step 425, the dielectric layer 515 is exposed in a pattern to open solder lands such as SMT component land 510, shown in FIG. 14, of the printed circuit board 500 and areas where the EC wires are to be interconnected with the original printed circuit board. The dielectric layer 515 is exposed at an energy of, for example, 150 mJ to 300 mJ. A mask is used during the exposure to form a pattern on the dielectric layer. The pattern features may be 0.0127 cm (0.005 inches) to 0.0254 mm (0.010 inches) larger than the finished size of the solder lands and EC wire areas to allow for misregistration. The dielectric is not completely crosslinked when exposed at an energy of 150 to 300 mJ. As a result, the dielectric material can reflow into the delete holes during the lamination step described below. Depending on circuit pattern to be added, and dielectric material type, pre-expose operation 425 may or may not be used.

At step 430, copper foil layer 520 is laminated onto the dielectric layer 515. The copper foil layer 520 is laminated using a lamination press at 125° C. for 60 minutes at 300 psi to 500 psi. During the lamination of the copper foil 520, the dielectric layer 515 flows into the delete holes. The resulting structure is a copper foil layer 520 that is essentially planar. The copper foil layer 520 is applied to one or both sides of the printed circuit board requiring EC wire adds or component adds.

At step 435, the copper foil layer 520 is patterned to form the EC wires and component add land patterns. Step 435 includes the steps of preparing the surface of the copper foil layer 520 and applying a resist material over the copper foil layer 520. The resist material is exposed using a mask that includes a pattern to form the EC wires and the component add land patterns on the copper foil layer 520. Subsequently, the resist is developed and the copper foil layer 520 is etched to form the pattern in the copper foil layer 520. After etching is complete, the remaining resist is removed.

At step 440, the dielectric layer 515 is exposed in a pattern to open solder lands such as SMT component land 510 of the original printed circuit board 500 and areas where the EC wires are to be interconnected with the printed circuit board 500. The photoimageable dielectric layer 515 is exposed at an energy of, for example, 1000 mJ. The dielectric is fully crosslinked when exposed with an energy of 1000 mJ. The mask used in step 440 is the same as the mask used in step 425 except the size of the solder lands and EC wire areas are the finished sizes of these features. The dielectric layer 515 may remain across the entire printed circuit board 500 surface, or it may be removed in most areas, and only left beneath the EC wires and the component add land patterns.

At step 445, the dielectric layer 515 is baked at 125° C. for 30 minutes. At step 450, the dielectric layer 515 is developed using propylene carbonate ($PCO_3$). During this step, dielectric material is removed from the original SMT component lands 510 and EC wire interconnect features. Exemplary wire interconnect features for interconnecting the EC wire layer to the printed circuit board 500 are shown in FIGS. 15 through 19 and are described below.

The dielectric layer 515 is at least partially removed from between the SMT component land 510 and the copper foil layer 520. This recess 525 provides a capillary action when the solder paste is reflowed insuring a high yield, extremely reliable interconnect.

At step 455, the dielectric is cured in an oven at 185°0 C. for one (1) hour. At step 460, if necessary, a new solder mask layer is applied over the finished copper foil layer 520. At step 465, the EC wires and component add land patterns are electrically interconnected during standard SMT assembly by screening solder paste using a solder stencil and reflowing the solder paste. This step does not change the standard SMT assembly process except that the solder stencil is designed to include openings for the EC wire interconnects, if they are not made at original SMT component lands 510.

The process described above provides a low cost technique for printed circuit board EC wire and component additions, where the EC wires provide the same electrical performance as the original printed circuit board, and the integrity of the original circuit board is not compromised. The EC wire plane provides electrical performance equivalent to the wiring of the original printed circuit board. Further, the fabrication of the EC wire plane employs a combination of individual steps that do not require specialized equipment.

Although fabrication of one EC wire plane was described above, a number of EC wire planes may be formed successively on top of each other on the printed circuit board 500. In this case, the dielectric layer 515 electrically separates one EC wire plane from another except where interconnections are to be formed between the EC wire planes. Each EC wire plane increases the thickness of the printed circuit board by 0.0762 cm (0.003 inches) to 0.01016 cm (0.004 inches).

Figure 15:
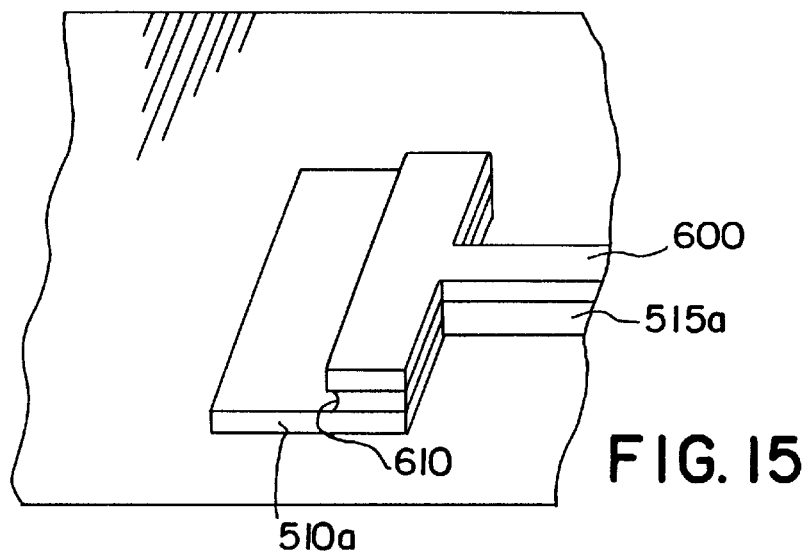
FIG. 15 is a perspective view of a portion of an electronic circuit card according to another exemplary embodiment of the present invention during formation; an EC wire termination feature is provided in one circuit layer but is not yet interconnected.
Figure 16:
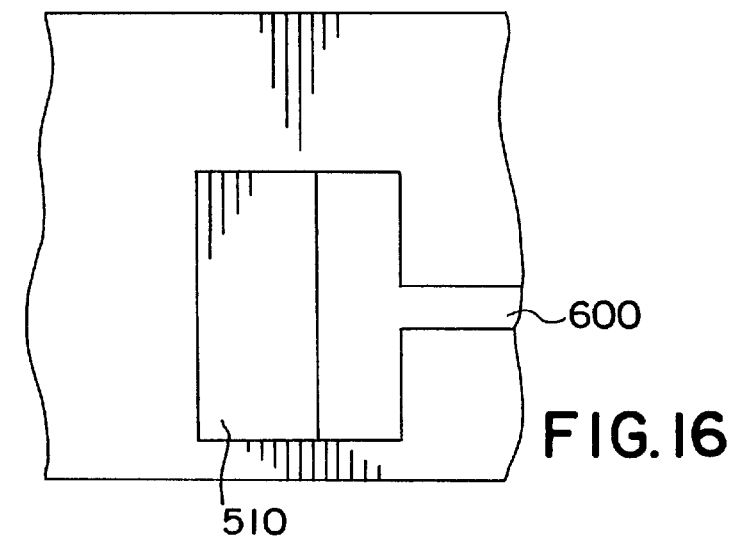
FIG. 16 is a top view of the electronic circuit card of FIG. 15.

The shape and size of the EC wire interconnect feature for connecting to the printed circuit board varies depending on the feature to be connected. As is shown in FIG. 15, a standard 0.127 cm (0.05 inches) pitch SMT component land 510a having a land width of 0.06096 cm (0.024 inches) or smaller may have an EC wire termination feature 600 of the same width as the SMT component land 510a. FIG. 16 is a top view of the electronic circuit card shown in FIG. 15. The EC wire interconnect feature extends from one end of the SMT component land 510a for 25–50% of the land length. The dielectric layer 515a is formed between the EC wire termination feature 600 and the SMT component land 510a.

The dielectric layer 515a is at least partially removed from between the EC wire termination feature 600 and the SMT component land 510a or other feature. This recess 610 provides a capillary action when the solder paste is reflowed insuring a high yield, extremely reliable interconnect.

Figure 17:
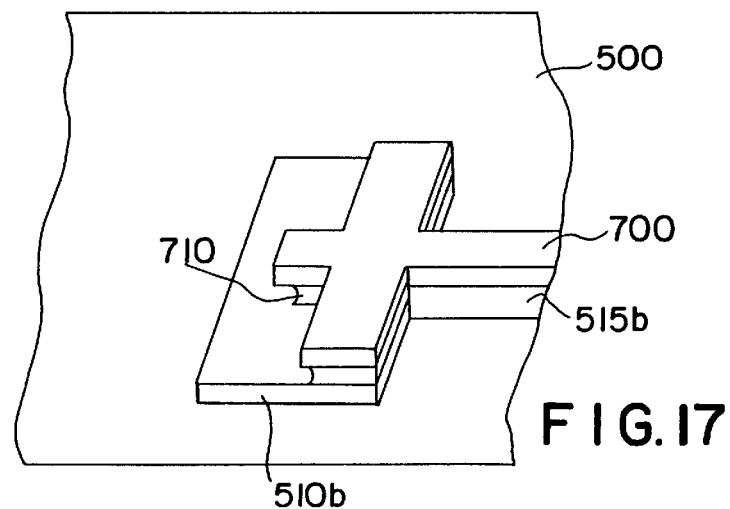
FIG. 17 is a perspective view of a portion of an electronic circuit card according to another exemplary embodiment of the present invention during formation; an EC wire termination feature is provided in one circuit layer but is not yet interconnected.
Figure 18:
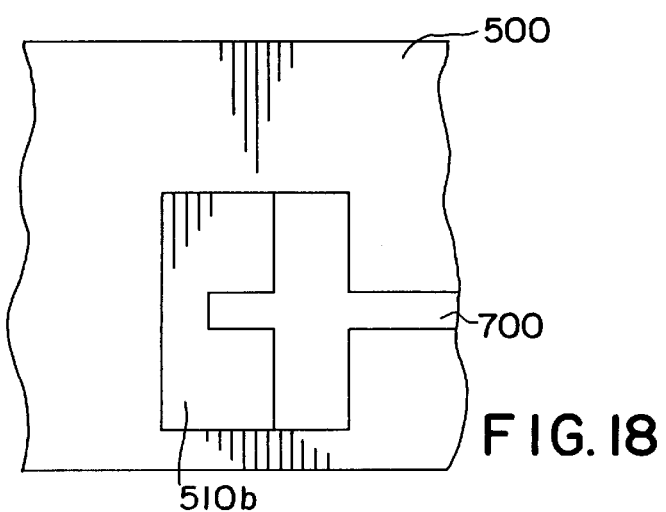
FIG. 18 is a top view of the electronic circuit card of FIG. 17.

FIGS. 17 and 18 illustrate another EC wire termination feature 700 for an "805" or larger chip capacitor/resistor SMT component land 510b. The EC wire termination feature 700 is T-shaped with the cross of the "T" extending the entire width of the SMT component land and extending over the original land by 0.0127 cm (0.005 inches) to 0.0254 cm (0.01 inches). The base or leg of the "T" has a width of 0.0508 (0.02 inches) to 0.0635 cm (0.025 inches) and extends along the center line of the width of the SMT component land 510b for approximately 75% of the land length.

Figure 19:
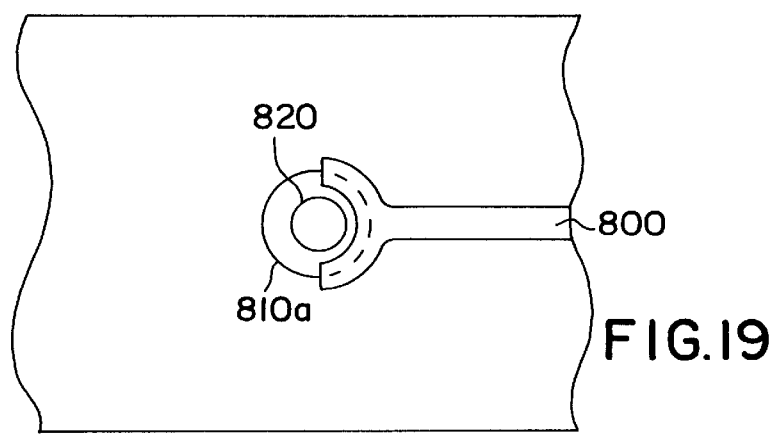
FIG. 19 is a top view of a portion of an electronic circuit card according to a further exemplary embodiment of the present invention during formation; an EC wire termination feature is provided in one circuit layer but is not yet interconnected.

FIG. 19 illustrates another EC wire termination feature 800 for a pin-in-hole or through via land. The EC wire termination feature 800 has a semi-circle shape having 30–50% of the original land circumference and a width of 0.0381 cm (0.015 inches) to 0.0508 cm (0.02 inches). The EC wire termination feature 800 overlaps the original land 810a at approximately the midpoint of the PTH 820 and PTH land 810a radius.

The dielectric layers 515b may be partially removed from between the EC wire termination features 700 and 800 in the EC wire layer and the SMT component land or other feature. This recess 710 provides a capillary action when the solder paste is reflowed insuring a high yield, extremely reliable interconnect. Other EC wire termination features may be formed. For example, an EC wire termination feature similar to the surface land 38, shown in FIG. 1, may be used.

In an alternative embodiment, the process described above may be used to form external shield or ground planes to provide improved EMI performance. The process of forming the external shield or ground plane is the same as described above except that the copper foil layer is left intact but for component openings. These external shield planes may be interconnected to internal ground plane vias using solder and a reflow process as described above.

Therefore, the present invention has been disclosed by way of illustration and not limitation, and reference should be made to the following claims to determine the scope of the present invention.

What is claimed:

1. An electronic circuit card comprising:

an electronic circuit card having external electrical circuits;

a dielectric layer formed on the electronic circuit card; and a metal layer formed on the dielectric layer,
wherein a land is formed on the electronic circuit card and a termination feature is formed on the land, the termination feature includes the metal layer formed on the dielectric layer where the dielectric layer is partially removed from between the termination feature and the metal layer, and the termination feature is T-shaped.

2. An electronic circuit card comprising:

an electronic circuit card having external electrical circuits;

dielectric layer formed on the electronic circuit card; and a metal layer formed on the dielectric layer,
wherein a land is formed on the electronic circuit card and a termination feature is formed on the land, the termination feature includes the metal layer formed on the dielectric layer where the dielectric layer is partially removed from between the termination feature and the metal layer, and the termination feature is semi-circle shaped.

3. An electronic circuit card comprising:

an electronic circuit card having external electrical circuits;

a dielectric layer formed on the electronic circuit card; and a metal layer formed on the dielectric layer,
wherein a land is formed on the electronic circuit card and a termination feature is formed on the land, the termination feature includes the metal layer formed on the dielectric layer where the dielectric layer is a partially removed from between the termination feature and the metal layer, and the metal layer is patterned and the termination feature is T-shaped.

* * * * *